(12) United States Patent
Liu et al.

(10) Patent No.: US 9,231,171 B2
(45) Date of Patent: Jan. 5, 2016

(54) FLEXIBLE LED ASSEMBLIES AND LED LIGHT BULBS

(71) Applicants: HUGA OPTOTECH INC., Taichung (TW); INTERLIGHT OPTOTECH CORPORATION, Yangmei, Taoyuan County (TW)

(72) Inventors: Hong-Zhi Liu, Yangmei (TW); Tzu-Chi Cheng, Yangmei (TW)

(73) Assignees: HUGA OPTOTECH INC., Taichung (TW); INTERLIGHT OPTOTECH CORPORATION, Yangmei, Taoyuan County (TW)

( * ) Notice: Subject to any disclaimer, the term of this patent is extended or adjusted under 35 U.S.C. 154(b) by 0 days.

(21) Appl. No.: 14/480,084

(22) Filed: Sep. 8, 2014

(65) Prior Publication Data
US 2015/0069442 A1    Mar. 12, 2015

(30) Foreign Application Priority Data

Sep. 11, 2013  (TW) .............................. 102132806 A

(51) Int. Cl.
*H01L 33/62* (2010.01)
*H01L 33/50* (2010.01)
*F21K 99/00* (2010.01)
*H01L 25/075* (2006.01)
*F21V 3/00* (2015.01)
*F21Y 101/02* (2006.01)

(52) U.S. Cl.
CPC .............. *H01L 33/504* (2013.01); *F21K 9/135* (2013.01); *F21V 3/00* (2013.01); *F21Y 2101/02* (2013.01); *H01L 25/0753* (2013.01); *H01L 33/62* (2013.01)

(58) Field of Classification Search
CPC ..................................................... H01L 33/58
See application file for complete search history.

(56) References Cited

U.S. PATENT DOCUMENTS

| | | | | |
|---|---|---|---|---|
| 2009/0251882 A1* | 10/2009 | Ratcliffe | | 362/84 |
| 2011/0163683 A1* | 7/2011 | Steele et al. | | 315/192 |
| 2013/0111744 A1* | 5/2013 | Tischler et al. | | 29/832 |

* cited by examiner

*Primary Examiner* — Roy Potter
*Assistant Examiner* — Paul Patton
(74) *Attorney, Agent, or Firm* — Muncy, Geissler, Olds & Lowe, P.C.

(57) ABSTRACT

LED assemblies and related LED light bulbs. An LED assembly has a flexible, transparent substrate, an LED chip on the first surface and electrically connected to two adjacent conductive sections, a first wavelength conversion layer, formed on the first surface to substantially cover the LED chip, and a second wavelength conversion layer formed on the second surface. The flexible, transparent substrate has first and second surfaces opposite to each other, and several conductive sections, which are separately formed on the first surface.

13 Claims, 4 Drawing Sheets

FLEXIBLE LED ASSEMBLIES AND LED LIGHT BULBS

CROSS-REFERENCE TO RELATED APPLICATION

This application claims priority to and the benefit of Taiwan Application Serial Number 102132806 filed on Sep. 11, 2013, which is incorporated by reference in its entirety.

BACKGROUND

The present disclosure relates generally to flexible light emitting diode (LED) assemblies and their applications, more specifically to the LED assemblies suitable for omnidirectional light appliances.

LED has been used in different kinds of appliances in our life, such as traffic lights, car headlights, street lamps, computer indicators, flashlights, LCD backlight modules, and so on. LED chips as light sources for appliances are produced by wafer manufacturing process in the front end, and then undergo LED packaging in the back end to result in LED assemblies or apparatuses.

LED packaging mainly provides mechanical, electrical, thermal, and optical supports to LED chips. LED chips, which are kind of semiconductor products, are prone to performance degradation, or aging, if exposed for a long time in an atmosphere of humidity or chemical. To isolate the LED chips from the unfriendly atmosphere, epoxy resins are commonly used to cover and seal them. Heat dissipation and light extraction should be also considered for LED packaging, such that LED products could have long lifespan, high brightness and power conservation. For example, the heat generated by an LED chip, if not well dissipated, could deteriorate the LED chip, shorten its lifespan, and downgrade its reliability. Optical design, such as the way to extract and direct the light into a preferable angle or distribution, also plays an important role for LED packaging.

Design for packaged white LEDs is more complicated and needs further consideration of color temperature, color rendering index, phosphor, etc. A white LED could be provided by using phosphor to convert a portion of the blue light from a blue LED chip into green/yellow light, such that the mixture of the lights is perceived as white light by human eyes. Because human eyes are vulnerable to high-intensity blue light, the blue light from a blue LED chip in a white LED package should not emit outward directly without its intensity being attenuated by phosphor. In other words, the blue light should be kind of "sealed" or "capsulated" by phosphor inside a white LED package so as to prevent blue light from leakage to human eyes.

SUMMARY

An LED assembly comprises a flexible, transparent substrate, an LED chip on the first surface and electrically connected to two adjacent conductive sections, a first wavelength conversion layer, formed on the first surface to substantially cover the LED chip, and a second wavelength conversion layer formed on the second surface. The flexible, transparent substrate comprises first and second surfaces opposite to each other, and several conductive sections, which are separately formed on the first surface.

BRIEF DESCRIPTION OF THE DRAWINGS

Non-limiting and non-exhaustive embodiments of the present disclosure are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The disclosure can be more fully understood by the subsequent detailed description and examples with references made to the accompanying drawings, wherein.

DETAILED DESCRIPTION

Figure 1:
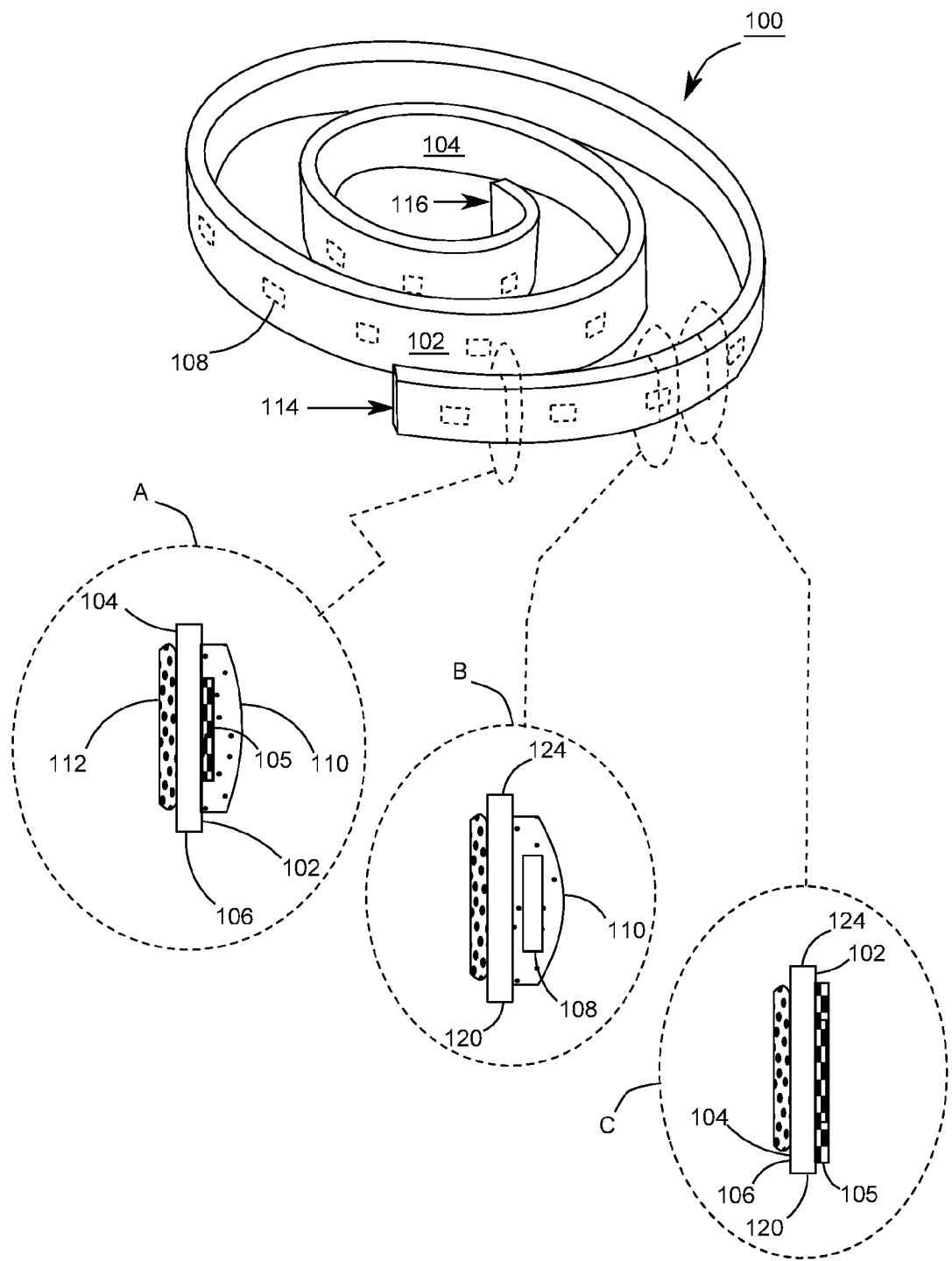
FIG. 1 shows an LED assembly according to an embodiment of the disclosure.

An LED assembly 100 according to an embodiment of the disclosure is described in detail with reference to FIG. 1, which shows perspective and cross sectional views of the LED assembly 100. As shown in FIG. 1, the LED assembly 100 is flexible, and is capable of being curved to be a tape on a reel. Depending on actual applications, the LED assembly 100 could be cut into pieces with proper lengths, each capable of being a light source in a lighting apparatus such as a light bulb. The cross sectional views A, B and C are derived from different locations of the LED assembly 100 in FIG. 1.

The LED assembly 100 has a flexible, transparent substrate 106, which is, in one embodiment, composed of a non-conductive material such as glass or resin. The transparent substrate 106 has surfaces 102 and 104 opposite to each other, and facing the opposite directions respectively and sidewalls 120 and 124 on the surfaces 102 and 104. As demonstrated in FIG. 1, the transparent substrate 106 is a thin, longitudinal strip, having two opposite ends 114 and 116. In this specification, "transparent" means having the property of transmitting rays of light, and could refer to as transparent, translucent or semitransparent. The bodies situated beyond or behind the transparent substrate 106 could be distinctly or obscurely seen. Thickness of the transparent substrate 106, or the distance between the surfaces 102 and 104, could be 150 micrometer or less.

Figure 2:
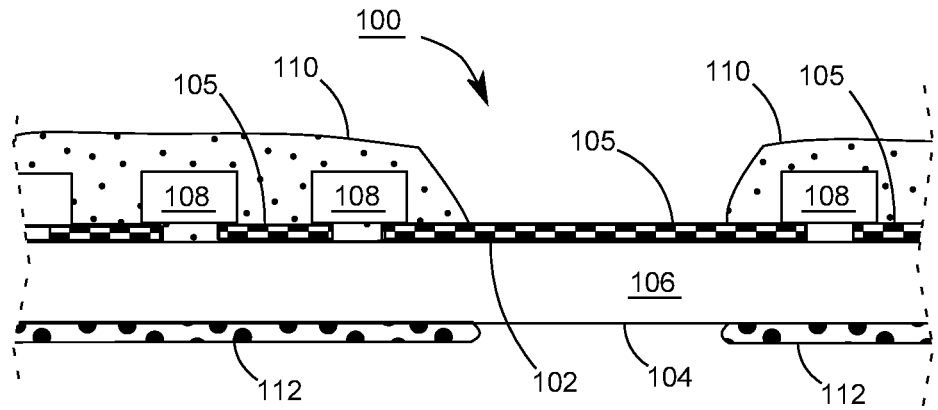
FIG. 2 is a cross sectional view of the LED assembly along a longitudinal line.
Figure 3A:
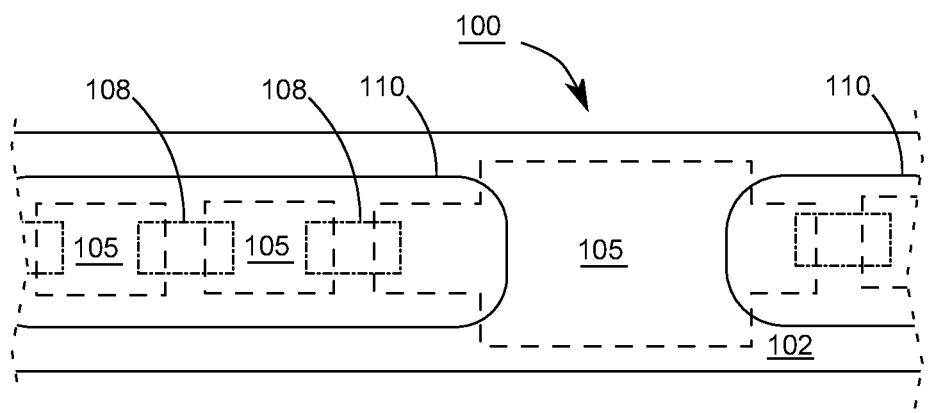
FIGS. 3A and 3B show two opposite surfaces of the LED assembly in FIG. 1.
Figure 3B:
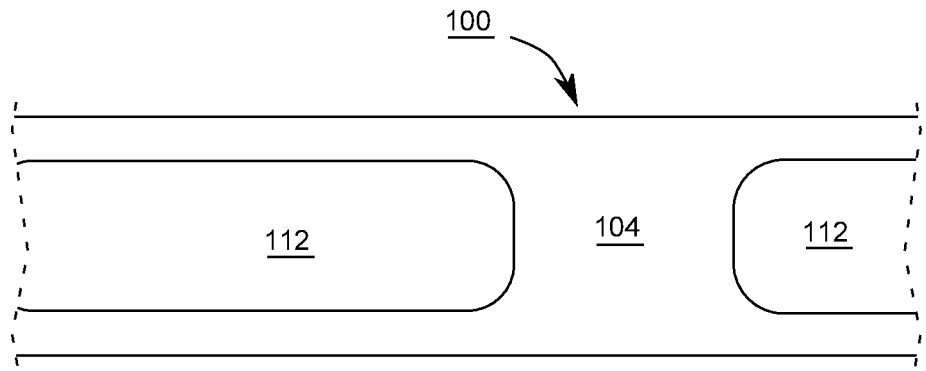

FIG. 2 is a cross sectional view of the LED assembly 100 along a longitudinal line passing through ends 114 and 116. FIGS. 3A and 3B show two opposite surfaces of the LED assembly 100.

On the surface 102 of the flexible, transparent substrate 106 has conductive sections 105, which are formed by printing for example. Another method of forming the conductive sections 105 includes forming designed conductive patterns through masks, comprising steps of coating a conductive film on the surface 102, and patterning the conductive film by lithography and etching to form conductive patterns on the surface 102, wherein the conductive sections 105 can be further divided into different conductive sections 105. The conductive sections 105 could be composed of transparent material, such as indium tin oxide (ITO) or silver thin film, and the thickness of the thin film should be well controlled to be transparent to the light emitted from the blue LED chips 108.

The embodiment in FIGS. 1, 2, 3A and 3B has blue LED chips 108 on the surface 102, each connecting between two adjacent conductive sections 105. In one embodiment, a blue LED chip 108 might have only one single LED cell, having a forward voltage of about 2 to 3 volts, and this kind of LED chip is referred to as a low-voltage LED chip hereinafter. Comparatively, a blue LED chip 108 in another embodiment might include several LED cells connected in series, and is referred to as a high-voltage LED chip hereinafter, because the forward voltage of the LED chip could be as high as 12V, 24V, or 48V, much higher than that of a low-voltage LED chip. In one embodiment, each LED cell in an LED chip has a light-emitting layer, and the LED cell might be formed on an epitaxial or non-epitaxial substrate. More specifically, the LED cells without individual substrate in a high-voltage LED chip are electrically connected to each other on a common substrate by semiconductor processes.

According to some embodiments of the disclosure, on the surface 102 of the LED assembly 100 are not only blue LED chips 108 but also LED chips (not shown) that emit light different than blue. For example, the LED assembly 100 could include red, green, and/or yellow LED chips to have light mixture with a desired spectrum or an appropriate color temperature. Some or all of the LED chips in the LED assembly 100, whether it is blue or not, could be correspondingly replaced by LED packages with one or more LED chips in some embodiments.

The blue LED chips 108 in FIGS. 1, 2 and 3A are positioned on the surface 102 and arranged as a row along a longitudinal line connecting the ends 114 and 116. The cathode and anode of one blue LED chip 108 contact with two adjacent conductive sections 105 respectively, in such a way that all the blue LED chips 108 are electrically connected in series and perform as an LED with a forward voltage higher than that of the individual LED chip 108, where the forward voltage is the summation of the forward voltages of the individual blue LED chips 108. This disclosure is not limited to, however. In some embodiments, the blue LED chips 108 and any other kinds of LED chips on the surface 102 could be connected in many different configurations, including series, parallel, and the combination thereof.

In one embodiment, solder paste joints are used to mount the blue LED chips 108 on the conductive sections 105, with a flip chip technique, to provide both electric interconnection and mechanical adhesion. Even though solder paste is opaque, the joints hardly block or diminish the light emitted from the LED assembly 100 because they are tiny in size and could be ignored in view of the overall light intensity. In another embodiment, an anisotropic conductive film (ACF) is used to mount the blue LED chips 108 on the conductive sections 105. For example, the conductive sections 105 are first coated with an ACF, and the blue LED chips 108 are then mounted on the conductive sections 105 through ACF, which provides adhesion and electric connection between the blue LED chips and the conductive sections 105. Alternatively, eutectic alloy or silver paste could be employed to mount the blue LED chips 108 on the conductive sections 105.

In one embodiment, each of the blue LED chips 108 is mounted on a portion of the surface 102 where no conductive sections 105 are formed, and interconnection means, such as bonding wires, are then formed to connect the blue LED chips 108 to the conductive sections 105. In practice, material with excellent thermal conductivity but poor electric conductivity is employed first to adhere the blue LED chips 108 to the surface 102 or the LED chips 108 are directly connected to the surface 102, and then bonding wires are provided to electrically connect blue LED chips 108 and conductive sections 105.

Over the blue LED chips 108 in FIGS. 2 and 3A is a phosphor layer 110, a wavelength conversion layer. The phosphor layer 110 comprises epoxy or plastic and wavelength conversion material dispersed therein, such as phosphor or dye powder, that is capable of being stimulated by some light emitted from the blue LED chips (with a dominant wavelength ranging from 430 nm to 480 nm) to produce green or yellow light (with a dominant wavelength ranging from 540 nm to 590 nm), so that the mixture of the lights is perceived as white light by human eyes. FIG. 1 is illustrative to show the blue LED chips 108 is under the phosphor layer 110, but in some embodiments the blue LED chips 108 could not be seen because of the phosphor in the phosphor layer 110. The phosphor layer 110 could comprise thermosetting resin, thermoplastic resin, light-cured resin, acrylic resin, epoxy, or silicone, for example.

FIGS. 2 and 3A show that the blue LED chips 108 are covered by the phosphor layer 110, which does not cover all conductive sections 105. The cross sectional view C in FIG. 1 also demonstrates a portion of a conductive section 105 is not covered by the phosphor layer 110. The phosphor layer 110 shown in FIGS. 2 and 3A could form segments with different sizes, and the segments are arranged in a row aligned with a longitudinal line connecting ends 114 and 116. The gap between two adjacent segments exposes a portion of a conductive section 105.

Dispensing or screen printing could form the phosphor layer 110 on the blue LED chips 108. Each segment of the phosphor layer 110 could cover one or more blue LED chips 108. Possibly, one segment of the phosphor layer only covers one blue LED chip 108, while another segment covers several blue LED chips 108. The phosphor layer 110 could be epoxy or silicone, for example, dispersed therein with one kind or several kinds of phosphor, and the phosphor includes, but is not limited to, yttrium aluminum garnet (YAG), terbium aluminum garnet (TAG), Eu-activated alkaline earth silicate, and SiAlON. The phosphor could be green-emitting or yellow-emitting phosphor having elements selected from a group consisting of Sr, Ga, S, P, Si, O, Gd, Ce, Lu, Ba, Ca, N, Eu, Y, Cd, Zn, Se, and Al.

Thickness and coverage of the phosphor layer 110 could determine the flexibility of the LED assembly 100. The thicker the phosphor layer 110 is, or the more the blue LED chips 108 that is covered by one segment of the phosphor layer 110, the less flexible the LED assembly 100 is.

As demonstrated in FIGS. 2 and 3B, on the surface 104, which is opposite to the surface 102, is another wavelength conversion layer, the phosphor layer 112, composition and manufacturing of which could be the same or similar with those of the phosphor layer 110. Similar with the phosphor layer 110, the phosphor layer 112 is formed to have segments and gaps alternatively arranged in a row. Basically, segments of phosphor layer 112 are formed on the positions of the surface 104 corresponding to the blue LED chips 108. Moreover, one segment of the phosphor layer 112 is corresponding to one blue LED chip 108, to multiple blue LED chips 108, or to a segment of phosphor layer 110. In other words, each blue LED chip 108 is substantially sandwiched by one segment of the phosphor layer 112 and one segment of the phosphor layer 110. One segment of the phosphor layer 112, nevertheless, could be used for, in association with the phosphor layer 110, sandwiching only one blue LED chip 108 in one embodiment, or several blue LED chips 108 in another embodiment. The phosphor layer 112 on the surface 104 might be absent in some embodiments while the phosphor layer 110 still presents. The phosphor layer 112 and the phosphor layer 110 could differ in materials in the phosphor or in the lights emitted by the phosphors having same chemical elements.

There on the surface 102 in one embodiment are red LED chips (not shown), and they could be sandwiched between the phosphor layers 110 and 112. In one embodiment, covering on the red LED chips is not the phosphor layer 110, but a transparent resin or epoxy layer that has no or little phosphor; and there is no phosphor layer 112 on the locations of the surface 104 corresponding to the red LED chips.

As demonstrated in FIG. 1, sidewalls 120 and 124 connect between surfaces 102 and 104, and are not covered or partially covered by the phosphor layer 110 or 112.

For assembling a lighting apparatus, a cutting instrument, such as a pair of scissors, a slitter, a film slitter or a cutting machine, could be used to cut the LED assembly 100 at the locations where the conductive sections 105 located without being covered by the phosphor layer 110 to result in several flexible LED filaments. An LED filament 130 produced by the cutting is shown in FIG. 4, where the LED filament 130 has, at its two ends, two conductive sections 105 uncovered by the phosphor layer 110 to be its cathode and anode respectively, from which the LED chips in the LED filament 130 might be driven by a power supply.

Figure 4:
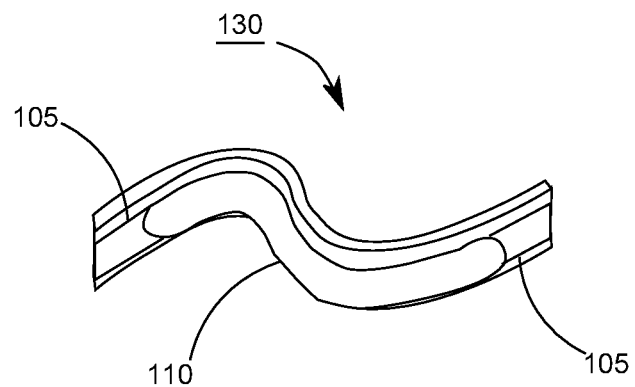
FIG. 4 demonstrates an LED filament produced from cutting the LED assembly in FIG. 1.
Figure 5:
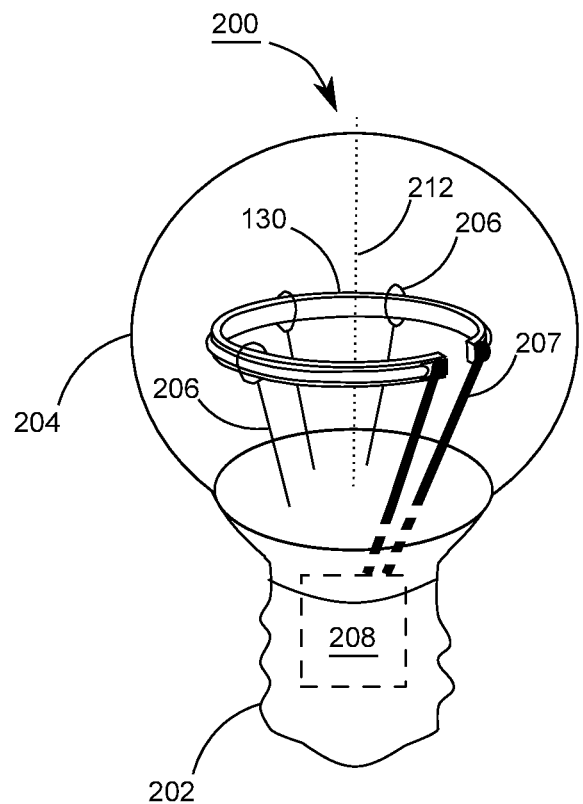
FIG. 5 demonstrates an LED light bulb with the LED filament in FIG. 4.

FIG. 5 demonstrates an LED light bulb 200 with the LED filament 130 in FIG. 4. The light bulb 200 further includes a bulb base 202, a transparent or semitransparent lamp cover 204, supports 206, conductive wires 207 and an LED filament 130. The bulb base 202 could be an Edison screw base capable of screwing into a matching socket and could be equipped with an LED driving circuit 208 therein. The lamp cover 204 is fixed on the bulb base 202, and the space enclosed by the lamp cover 204 and the bulb base 202 is referred to as an inner space. Inside the inner space, the LED filament 130 is fixed on the supports 206, which in one embodiment are substantially transparent in regard to the light emitted from the LED filament 130. The LED filament 130 is curved to form a circle with a notch, and the circle is on a plane perpendicular to the screw axis 212 of the bulb base 202 and the lamp cover 204. In other words, the screw axis 212 passes the center of the circle. The conductive wires 207 could be used to mechanically support the LED filament 130. The conductive wires 207 also electrically connect the two conductive sections 105 at two ends of the LED filament 130 electrically and the LED driving circuit 208 in the bulb base 202, so that the LED filament 130 can be driven to illuminate.

Advantages of the LED assembly 100 are below.

1. Blue light leakage could be decreased or eliminated. The light that the blue LED chips 108 emit in all the directions confronts either the phosphor layer 112 or the phosphor layer 110, except the directions to the sidewall 120 or 124. It implies that blue light leakage resulted from the blue light emitted from the blue LED chips leaves while the light passing through the sidewalls 120 and 124. Experiment results demonstrate that when the sidewalls 120 and 124 are small enough (or the substrate 106 is thin enough), for example smaller than 150 micrometer in height or in thickness, the blue light leakage through the sidewalls 120 and 124 is hardly detectable and could be ignored.

2. Each blue LED chip 108 could light in all directions as it is substantially not surrounded or encapsulated by opaque material. That is, the blue LED chip 108 is substantially surrounded or encapsulated by the phosphor layers 112 and 110, two transparent layers with phosphor dispersed therein.

3. The LED assembly 100 is easy for storage, as it could be curved into a tape on a reel.

4. The length of an LED filament can be adjusted. For producing a filament with an expected length, it might only need a knife or a pair of scissors to cut at appropriate locations of the LED assembly 100.

5. The forward voltage of an LED filament can be adjusted. Based upon the forward voltage required in an appliance, an assembler could cut the LED assembly 100 to have a filament with a suitable forward voltage. For example, if three blue LED chips 108 are connected in series between every two adjacent exposed conductive sections 105 in FIG. 1, a filament with an integral multiple of three blue LED chips 108 connected in series can be easily produced by cutting the LED assembly 100. In case that there is only one blue LED chip 108 between every two adjacent exposed conductive sections 105, it is possible to form an LED filament having any number of the blue LED chips 108 connected in series.

6. Simple assembling for a lighting apparatus. For example, the assembling could be realized by simple conventional soldering which adjoins the conductive wires 207 and the LED filament. Supports 206 can be optionally provided to support the filament 130 within the bulb at different locations, and the power supply is connected to the conductive sections 105 at the ends of the filament 130.

7. Suitability for an omnidirectional lighting apparatus. As exemplified by the LED bulb 200 in FIG. 5, the filament 130 is curved to be almost a circle which is omnidirectional in respect with the screw axis 212, while the blue LED chips 108 in the filament 130 emit light in all directions. Accordingly, the light bulb 200 could be an omnidirectional lighting apparatus while the lamp cover 204 is not opaque material.

Figure 6:
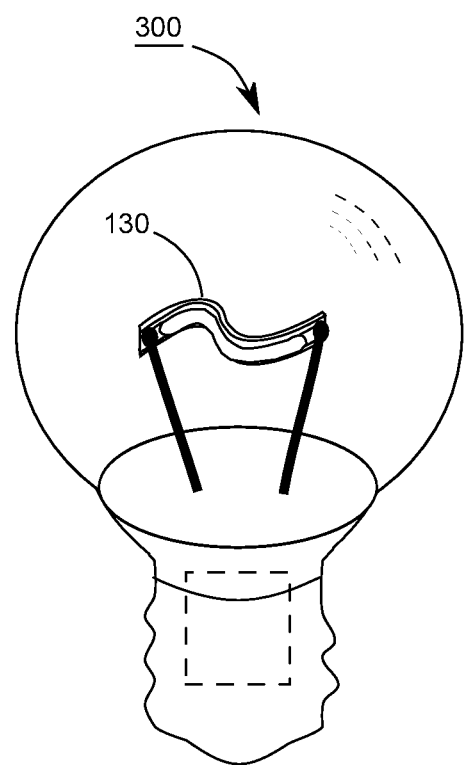
FIG. 6 is an LED light bulb disclosed in the disclosure.
Figure 7:
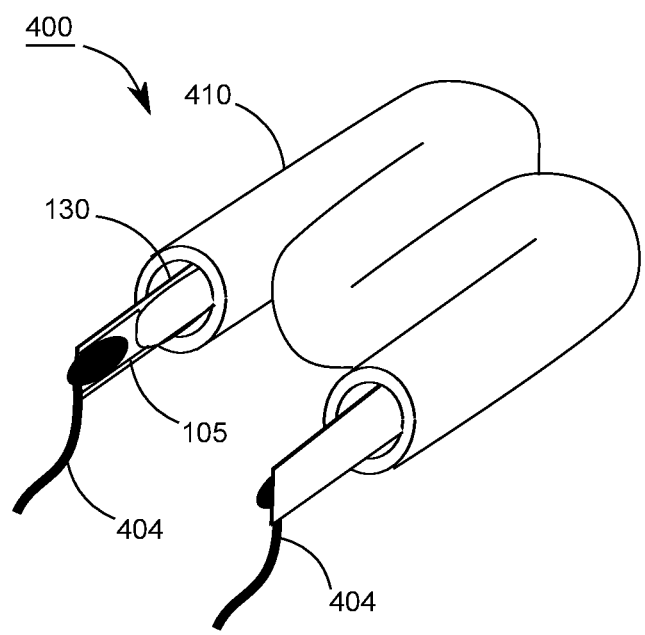
FIG. 7 demonstrates an LED bulb disclosed in the disclosure.

Even though the filament 130 is almost in a shape of a circle in FIG. 5, the invention is not limited to. An LED filament according to the disclosure is flexible and could be curved into any shape suitable for a lighting apparatus. Another LED bulb 300 according to the disclosure is demonstrated in FIG. 6, where the LED filament 130 has an arc, or a curved line shape, and is only supported or fixed in an inner space by two conductive supports. FIG. 7 demonstrates another LED bulb 400 of the disclosure, which has a transparent or translucent serpentine tube 410, and the LED filament 130 meanders through its channel. Two exposed conductive sections 105 at the ends of the LED filament 130 in FIG. 7 are soldered to conductive wires 404, which connect to a power supply (not shown) or a mains voltage plug (not shown) for supplying electric power and illuminating the LED filament 130. In another embodiment, the LED filament 130 could be adopted as a lighting source within a channel letter.

As aforementioned, the LED assembly according to embodiments of the disclosure is not limited to have only blue LED chips, and possibly has LED chips with a color other than blue. Furthermore, and not all blue LED chips are covered by a common phosphor layer. In one embodiment of the disclosure, some blue LED chips 108 are covered by the phosphor layer 110, but some are covered by another phosphor layer with phosphor different from that in the phosphor layer 110.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An LED assembly, comprising:
 a flexible, transparent substrate, comprising:
  first and second surfaces opposite to each other; and
  several conductive sections, separately formed on the first surface;
 an LED chip on the first surface and electrically connected to two adjacent conductive sections;
 a first wavelength conversion layer, formed on the first surface to substantially cover the LED chip; and
 a second wavelength conversion layer formed on the second surface.

2. The LED assembly as claimed in claim 1, wherein the transparent substrate is a longitudinal strip with two opposite ends, and the LED assembly comprises LED chips arranged in a first row along a longitudinal line connecting the opposite ends.

3. The LED assembly as claimed in claim 1, wherein the flexible, transparent substrate further comprises a sidewall connecting the first and second surfaces, and at least a portion of the sidewall is not covered by the first wavelength conversion layer.

4. The LED assembly as claimed in claim 1, wherein the conductive sections are transparent in view of the light emitted from the LED chip.

5. The LED assembly as claimed in claim 1, wherein at least one of the conductive sections has a portion not covered by the first wavelength conversion layer.

6. The LED assembly as claimed in claim 1, wherein the LED chip is flipped over and mounted on the first surface.

7. The LED assembly as claimed in claim 1, wherein the first wavelength conversion layer comprises a phosphor.

8. The LED assembly as claimed in claim 1, wherein the LED assembly is capable of being curved to be a tape on a reel.

9. An LED light bulb, comprising:
 a base;
 a lamp bulb, fixed on the base to define an inner space; and
 the LED assembly claimed in claim 1, positioned inside the inner space and electrically connected to the base.

10. The LED light bulb as claimed in claim 9, wherein the LED assembly is curved to have an arc.

11. The LED light bulb as claimed in claim 9, wherein the LED light bulb has a screw axis and the LED assembly is curved to be on a plane perpendicular to the screw axis.

12. The LED light bulb as claimed in claim 11, wherein the LED assembly is curved to substantially be a circle.

13. The LED light bulb as claimed in claim 9, further comprising two conductive wires respective connected to two of the conductive sections.

* * * * *